United States Patent [19]

Kanayama et al.

[11] Patent Number: 4,647,495
[45] Date of Patent: Mar. 3, 1987

[54] ELECTROMAGNETIC REFLECTION BODY

[75] Inventors: Tatsuya Kanayama, Kodaira; Yutaka Yamanaka, Koganei; Hitoshi Toyoda, Iruma; Akihiko Tanaka; Toshikazu Shinogaya, both of Kodaira, all of Japan

[73] Assignee: Bridgestone Corporation, Tokyo, Japan

[21] Appl. No.: 764,902

[22] Filed: Aug. 12, 1985

[30] Foreign Application Priority Data

Aug. 10, 1984 [JP] Japan .................. 59-167607

[51] Int. Cl.[4] .............................. B32B 7/00
[52] U.S. Cl. ...................... 428/246; 57/901; 428/229; 428/257; 428/284; 428/285
[58] Field of Search ............... 57/901; 428/257, 258, 428/259, 229, 246, 284, 285

[56] References Cited

U.S. PATENT DOCUMENTS

| | | | |
|---|---|---|---|
| 4,015,038 | 3/1977 | Romanski et al. | 428/257 |
| 4,507,354 | 3/1985 | Ishikawa et al. | 428/246 |
| 4,554,204 | 11/1985 | Ono et al. | 428/246 |

Primary Examiner—James J. Bell
Attorney, Agent, or Firm—Sughrue, Mion, Zinn, Macpeak, and Seas

[57] ABSTRACT

An electromagnetic reflection body is disclosed, which comprises a woven fabric made from a blended yarn of metallic filament and organic or inorganic fiber, and a fiber reinforced synthetic resin united therewith in one piece. This reflection body is used for an electromagnetic wave reflector, an electromagnetic interference shielding plate and the like.

12 Claims, 1 Drawing Figure

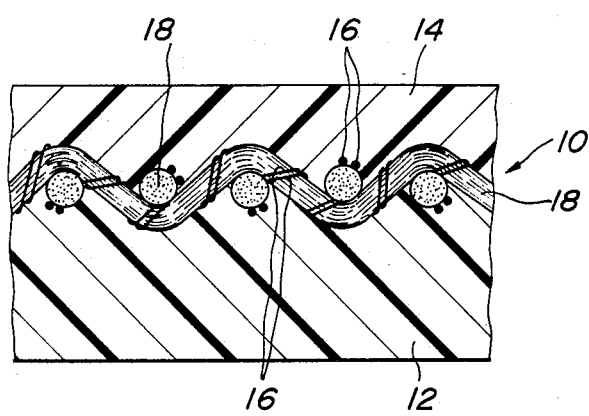

ELECTROMAGNETIC REFLECTION BODY

BACKGROUND OF THE INVENTION

Field of the Invention and Related Art Statement

This invention relates to an electromagnetic reflection body for use in an electromagnetic wave reflector, an electromagnetic interference shielding plate or the like.

The electromagnetic reflection body is required to be used in the electromagnetic wave reflector as a parabolic antenna for radio wave communication or in the electromagnetic interference shielding plate for office automation apparatuses such as a personal computer, a facsimile equipment, a copying machine and the like.

For this purpose, woven or nonwoven fabrics made from carbon fiber or aluminum-coated glass fiber, wire gauge and the like are used as an electromagnetic reflecting member. However, the woven fabric of carbon fiber or aluminum-coated glass fiber is expensive in cost, while the nonwoven fabric of carbon fiber or aluminum-coated glass fiber is apt to cause flowing of fibers accompanied with the fluidization of resin in molding and to be broken in the formation of a parabolic face for the parabolic antenna. On the other hand, the wire gauge is liable to cause peeling at the boundary between the wire gauge and the synthetic resin because the adhesion to the synthetic resin is poor and also the elastic modulus, thermal expansion coefficient and so on are different between the wire gauge and the synthetic resin.

SUMMARY OF THE INVENTION

With the foregoing in mind, it is an object of the invention to provide electromagnetic reflecting members which are excellent in the compatibility with the synthetic resin and rich in flexibility without causing peeling at the boundary and have an improved curved moldability.

According to the invention, there is the provision of an electromagnetic reflection body comprising a woven fabric made from a blended yarn of metallic filament and organic or inorganic fiber as an electromagnetic reflecting member, and a fiber reinforced synthetic resin united therewith in one piece.

BRIEF DESCRIPTION OF THE DRAWING

A single FIGURE is a partially sectional view of an embodiment of the electromagnetic reflection body according to the invention.

DESCRIPTION OF THE PREFERRED EMBODIMENTS

For the metallic filament, use may be made of brass wire, copper wire, stainless steel wire, soft steel wire and the like, among which the brass wire is preferably used. The diameter of the metallic filament is favorable to be not more than 500 $\mu$m in order to enhance weight-saving and moldability of the electromagnetic reflecting member.

For the organic fiber, use may be made of nylon fiber, polyester fiber, acrylic fiber, rayon fiber and the like. For the inorganic fiber, use may be made of glass fiber, carbon fiber, silicon carbide fiber and the like. Among them, the use of glass fiber is preferable.

According to the invention, 1 to 5 metallic filaments are twisted with the glass fiber to form a blended yarn, from which is preferably produced a woven fabric having a thread count of 10 to 50 yarns per width of 25 mm as an electromagnetic reflecting member.

The electromagnetic reflection body according to the invention is obtained by uniting such an electromagnetic reflecting member with a fiber reinforced synthetic resin in one piece. For instance, the electromagnetic reflection body is produced by laminating a sheet molding compound (SMC) as a reinforcing layer onto the back surface of the electromagnetic reflecting member and subjecting the resulting assembly to a compression molding under heating.

In order to protect the front surface or reflection surface of the electromagnetic reflection body, after the electromagnetic reflecting member and SMC as a reinforcement therefor are molded into one piece, a non-solvent type synthetic resin such as urethane paint or the like may be coated onto the front surface of the resulting assembly in a mold. Alternatively, the electromagnetic reflecting member may be laminated at the back surface with SMC as a reinforcement and at the front surface or reflection surface with a cloth mat or surface mat of glass fiber or the mat impregnated with a synthetic resin as a surface protecting layer, and then subjected to a compression molding under heating.

In any case, electromagnetic reflection bodies having a thickness of not more than 0.7 mm and a high reflectivity can be obtained according to the invention.

The following examples are given in illustration of the invention and are not intended as limitations thereof.

EXAMPLE 1

This example shows the manufacture of FRP parabolic antenna using an electromagnetic reflection body as shown in the single FIGURE, wherein an electromagnetic reflecting member 10 is integrally united at the back surface with a reinforcement 12 and at the front surface or reflection surface with a protecting layer 14.

The electromagnetic reflecting member 10 was prepared by using a blended yarn obtained by twisting two brass wires 16 of 0.1 mm in diameter along glass fibers 18. That is, the electromagnetic reflecting member 10 was a woven cloth made from such blended yarns and having a thread count of 24 yarns per width of 25 mm in each of warp and weft.

The electromagnetic reflecting member 10 was laminated with a surface mat of glass fiber as the protecting layer 14 and SMC as the reinforcement 12, which was subjected to a compression molding in a mold at a heating temperature of 140° C. under a clamp pressure of 50 kg/cm$^2$ for 5 minutes to thereby obtain an electromagnetic reflection body for the parabolic antenna. In this case, the surface protecting layer of 0.1–0.5 mm in thickness may be formed by properly selecting the unit weight of the glass fiber surface mat within a range of 16–100 g/m$^2$.

The resulting electromagnetic reflection body had a reflection coefficient of 0.99 (reflection coefficient of aluminum plate is 1.0) as measured at a frequency of 12 GHz by means of a reflectometer, and a surface resistivity of about 0.2 $\Omega$/square.

EXAMPLE 2

A parabolic antenna was manufactured in the same manner as described in Example 1, except that the blended yarn was prepared by twisting two stainless steel #40 wires of 0.12 mm in diameter along glass fibers and the woven fabric had a thread count of 20 yarns per width of 25 mm in each of warp and weft. The resulting antenna had a reflection coefficient of 0.98 and a surface resistivity of about 2 Ω/square.

EXAMPLE 3

A parabolic antenna was manufactured in the same manner as described in Example 1, except that the blended yarn was produced by twisting a single brass wire of 0.1 mm in diameter along glass fibers and the woven fabric had a thread count of 24 yarns per width of 25 mm. The resulting antenna had a surface resistivity of 0.5 Ω/square.

EXAMPLE 4

The same electromagnetic reflecting member as used in Example 1 was subjected together with SMC to a compression molding in a mold at 140° C. under a clamp pressure of 50 kg/cm² for 2 minutes. Thereafter, a one-can non-solvent type urethane paint was poured into the mold and the compression molding was again carried out under the same conditions as described above. In this way, the surface protecting layer of 0.2 mm in thickness was formed.

EXAMPLE 5

An electromagnetic reflecting member was produced by weaving blended yarns, each being obtained by twisting a single brass wire (diameter: 0.1 mm) and two vinylon fibers (fineness: 15μ), so as to have a thread count of 30 yarns per width of 25 mm in each of weft and warp. Then, an electromagnetic reflection body was manufactured by subjecting the electromagnetic reflecting member together with SMC to a compression molding at 140° C. and 50 kg/cm². The resulting reflection body had a reflection coefficient of 0.98 and a surface resistivity of 0.3 Ω/square.

EXAMPLE 6

An electromagnetic reflecting member was produced by weaving blended yarns made from a single brass wire (diameter: 0.1 mm) and a single aramide fiber (trade name Kevlar 49, 380 denier) so as to have a thread count of 22 yarns per width of 25 mm in each of weft and warp. Then, an electromagnetic reflection body was manufactured by using this electromagnetic reflecting member together with SMC in the same manner as described in Example 5. The resulting reflection body had a reflection coefficient of 0.98 and a surface resistivity of 0.4 Ω/square. Since the reflection body was excellent in the strength, it made possible to attain the reduction of thickness and the weight-saving in the manufacture of parabolic antenna or the like.

As mentioned above, the electromagnetic reflection body according to the invention is produced by integrally uniting a woven fabric made from a blended yarn of metallic filament and organic or inorganic fiber with a fiber reinforced synthetic resin. The adhesion between the woven cloth and the synthetic resin is excellent, which prevents peeling at the boundary. Also curved moldability is excellent, which prevents wrinkles on the reflection body.

What is claimed is:

1. An electromagnetic reflection body comprising a woven fabric made from a blended yarn of metallic filament and organic or inorganic fiber as an electromagnetic reinforcing member, and a fiber reinforced synthetic resin united therewith in one rigid piece.

2. The electromagnetic reflection body according to claim 1, wherein said blended yarn is produced by twisting 1 to 5 metallic filaments of not more than 500 μm in diameter with said organic or inorganic fiber.

3. The electromagnetic reflection body according to claim 1, wherein said metallic filament is selected from brass wire, copper wire, stainless steel wire and soft steel wire.

4. The electromagnetic reflection body according to claim 1, wherein said organic fiber is selected from nylon fiber, polyester fiber, acrylic fiber and rayon fiber.

5. The electromagnetic reflection body according to claim 1, wherein said inorganic fiber is selected from glass fiber, carbon fiber and silicon carbide fiber.

6. The electromagnetic reflection body according to claim 1, wherein said woven fabric has a thread count of 10–50 yarns per width of 25 mm in each of weft and warp.

7. The electromagnetic reflection body according to claim 1, wherein said fiber reinforced synthetic resin comprises a sheet molding compound.

8. The electromagnetic reflection body according to claim 1, wherein said body further comprises a surface protecting layer at its reflection surface side.

9. The electromagnetic reflection body according to claim 8, wherein said surface protecting layer is a surface mat or cloth mat of glass fiber possibly impregnated with a synthetic resin.

10. The electromagnetic reflection body according to claim 8, wherein said surface protecting layer is a coating of a non-solvent type synthetic resin.

11. The electromagnetic reflection body according to claim 8, wherein said surface protecting layer is a glass fiber cloth mat.

12. The electromagnetic reflection body according to claim 11, wherein said cloth mat is impregnated with a synthetic resin.

* * * * *